(12) United States Patent
Schaller et al.

(10) Patent No.: US 12,381,381 B2
(45) Date of Patent: Aug. 5, 2025

(54) SENSOR DEVICES WITH BUSBAR AND SENSOR CHIP AND DIELECTRICS ARRANGED THEREBETWEEN

(71) Applicant: Infineon Technologies AG, Neubiberg (DE)

(72) Inventors: Rainer Markus Schaller, Aichen (DE); Volker Strutz, Tegernheim (DE); Ronak Kalhor-Witzel, Neubiberg (DE); Hansjoerg Walter Kuemmel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 312 days.

(21) Appl. No.: 18/145,319

(22) Filed: Dec. 22, 2022

(65) Prior Publication Data

US 2023/0268727 A1 Aug. 24, 2023

(30) Foreign Application Priority Data

Jan. 17, 2022 (DE) .......................... 102022100978.5

(51) Int. Cl.
*H01G 4/224* (2006.01)
*H02G 5/00* (2006.01)

(52) U.S. Cl.
CPC ............. *H02G 5/005* (2013.01); *H01G 4/224* (2013.01)

(58) Field of Classification Search
CPC .......... G01R 1/20; G01R 15/20; H01G 4/224; H02G 5/005; H02G 5/00
USPC ....................................................... 174/72 B
See application file for complete search history.

(56) References Cited

U.S. PATENT DOCUMENTS

2021/0063445 A1* 3/2021 Schaller ............... G01R 15/207

FOREIGN PATENT DOCUMENTS

| CN | 111668365 A |   | 9/2020 |           |
|----|-------------|---|--------|-----------|
| CN | 115480089 A | * | 12/2022| G01R 15/14|
| DE | 102019123472 B3 |  | 3/2021 |       |
| DE | 102019009222 A1 |  | 6/2021 |       |
| EP | 1111693 A2  |   | 6/2001 |           |
| EP | 3644069 A1  |   | 4/2020 |           |

* cited by examiner

*Primary Examiner* — Timothy J Thompson
*Assistant Examiner* — Guillermo J Egoavil
(74) *Attorney, Agent, or Firm* — Harrity & Harrity, LLP

(57) ABSTRACT

A sensor device contains a busbar, a dielectric shell arranged over the busbar, a dielectric layer arranged over the busbar, and a sensor chip arranged within the dielectric shell, wherein the sensor chip is configured to detect a magnetic field induced by an electric current flowing through the busbar.

25 Claims, 3 Drawing Sheets

SENSOR DEVICES WITH BUSBAR AND SENSOR CHIP AND DIELECTRICS ARRANGED THEREBETWEEN

CROSS REFERENCE TO RELATED APPLICATION

This application claims priority to German Patent Application No. 102022100978.5 filed on Jan. 17, 2022, the content of which is incorporated by reference herein in its entirety.

TECHNICAL FIELD

The present disclosure relates to sensor devices with busbar and sensor chip and dielectrics arranged therebetween. Furthermore, methods for producing such sensor devices are described.

BACKGROUND

Sensor devices can contain a busbar and a sensor chip configured to detect a magnetic field induced by an electric measurement current flowing through the busbar. The magnitude of the measurement current can then be determined based on the detected magnetic field. During the operation of such sensor devices, adequate galvanic isolation should be present between the busbar and the sensor chip. Manufacturers and developers of sensor devices constantly endeavor to improve their products. In particular, it may be desirable here to combine a good sensor performance with reliable galvanic isolation.

SUMMARY

Various aspects relate to a sensor device. The sensor device includes a busbar. The sensor device furthermore includes a dielectric shell arranged over the busbar. The sensor device furthermore includes a dielectric layer arranged over the busbar. The sensor device furthermore includes a sensor chip arranged within the dielectric shell. The sensor chip is configured to detect a magnetic field induced by an electric current flowing through the busbar.

Various aspects relate to a sensor device. The sensor device includes a busbar. The sensor device furthermore includes a sensor chip arranged over the busbar. The sensor chip is configured to detect a magnetic field induced by an electric current flowing through the busbar. The sensor device furthermore includes a first dielectric layer arranged between the busbar and the sensor chip. The sensor device furthermore includes a second dielectric layer arranged between the first dielectric layer and the sensor chip. Footprints of the two dielectric layers are not congruent. The first dielectric layer projects beyond an edge of the busbar at at least one location.

BRIEF DESCRIPTION OF THE DRAWINGS

Sensor devices in accordance with the disclosure and methods for producing such sensor devices are explained in greater detail below with reference to drawings. The elements shown in the drawings are not necessarily rendered in a manner true to scale relative to one another. Identical reference signs may designate identical components.

DETAILED DESCRIPTION

In the following detailed description, reference is made to the accompanying drawings, which show for illustration purposes specific aspects and implementations in which the disclosure can be implemented in practice. In this context, direction terms such as, for example, "at the top", "at the bottom", "at the front", "at the back", etc. can be used with respect to the orientation of the figures described. Since the components of the implementations described can be positioned in different orientations, the direction terms can be used for illustration purposes, but are not restrictive in any way whatsoever. Further aspects can be used and structural or logical changes can be made, without departing from the concept of the present disclosure. In other words, the following detailed description should not be understood in a restrictive sense.

Schematic views of sensor devices in accordance with the disclosure are described below. In this case, the sensor devices can be illustrated in a general way in order to describe aspects of the disclosure qualitatively. The sensor devices can in each case have further aspects that are not illustrated in the figures for the sake of simplicity. For example, the respective sensor devices can be extended by any aspects described in association with other devices or methods in accordance with the disclosure.

Figure 1:
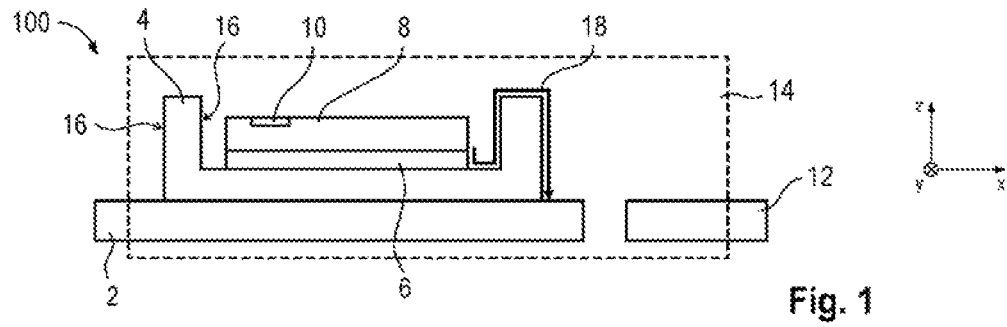
FIG. 1 schematically shows a cross-sectional side view of a sensor device 100 in accordance with the disclosure.

The sensor device 100 in FIG. 1 can comprise a busbar 2 and a dielectric shell (or dielectric trough) 4 arranged over the busbar 2. Furthermore, a dielectric layer (or a dielectric lamina) 6 can be arranged over the busbar 2. In FIG. 1, the dielectric layer 6 can be arranged by way of example on a base surface of the dielectric shell 4. The sensor device 100 can furthermore contain a sensor chip 8 arranged in the dielectric shell 4 and having one or more sensor elements 10. In the example in FIG. 1, the dielectric layer 6 can be arranged between the dielectric shell 4 and the sensor chip 8. Furthermore, the sensor device 100 can comprise one or more connection conductors 12. The aforementioned components of the sensor device 100 can be at least partly encapsulated by an encapsulation material 14.

The busbar 2 and the connection conductors 12 can for example be part of a leadframe or be fabricated therefrom. The two components can be electrically conductive, in particular, and can be produced for example (in particular completely) from metals and/or metal alloys, for example from copper, copper alloys, nickel, iron-nickel, aluminum, aluminum alloys, steel, stainless steel, etc. Only a single connection conductor 12 is illustrated in the example in FIG. 1. However, the sensor device 100 can comprise any desired number of further connection conductors 12. In the side view in FIG. 1, for example, further connection conductors can be arranged behind the connection conductor 12 shown and be concealed by the latter.

The busbar 2, the dielectric shell 4, the dielectric layer 6 and the sensor chip 8 can be secured to one another by securing materials, which are not illustrated in FIG. 1 for the sake of simplicity. The securing materials can comprise for example in each case one or more of the following: carbon-filled DAF (Die Attach Film), carbon-filled adhesive, weakly conductive glass solder, non-conductive DAF, non-conductive adhesive, conductive adhesive (in particular not silver-filled). The individual parts of the securing material that are arranged between the aforementioned components of the sensor device 100 can consist of an identical material or of different materials.

The busbar 2 can be configured to carry an electric current to be measured (measurement current). The measurement current flowing through the busbar 2 can be a current of a power circuit or high-power circuit and comprise for example a maximum current value of a few amperes, e.g., 10 amperes, or a maximum current value of up to 100 amperes or beyond that. The voltages underlying the current can likewise be from a few volts up to a few tens or hundreds of volts. In this case, the busbar 2 can be embodied in particular in an integral fashion. In FIG. 1, the busbar 2 and the connection conductor 12 are illustrated with an identical thickness in the z-direction. In further examples, however, the thicknesses of these two components in the z-direction can be different. In this case, in particular, a thickness of the busbar 2 can be greater than a thickness of the connection conductor 12. In one example, the two components can be parts of a dual gauge leadframe. In a further example, the two components can be parts of two leadframes having different thicknesses.

The sensor chip 8 can be fabricated from a semiconductor material and can be configured to detect a magnetic field induced by a measurement current flowing through the busbar 2. The intensity of the measurement current can be determined based on the detected magnetic field. Consequently, the sensor chip 8 can also be referred to as a magnetic field sensor chip or current sensor. The induced magnetic field can be detected by the sensor chip 8, or by the sensor element 10 thereof, in particular in a galvanically isolated or contactless manner. In this case, the sensor element 10 can at least partly overlap the busbar 2 as viewed in the z-direction.

The physical signals detected by the sensor chip 8 can be converted into electrical signals for further processing and can be forwarded via one or more electrical connecting elements (not shown) and also one or more of the connection conductors 12 to further components (not shown), for example to an ASIC (Application Specific Integrated Circuit). The sensor device 100 can be in particular a coreless sensor device, e.g., the sensor device 100 need not necessarily comprise or use a magnetic field concentrator to concentrate the magnetic field induced by the electric measurement current at the location of the sensor element 10.

In the example in FIG. 1, only a single sensor element 10 of the sensor chip 8 is shown for the sake of simplicity. In further examples, the sensor chip 8 can comprise one or more further sensor elements. For example, the sensor chip 8 can be a differential magnetic field sensor chip having two sensor elements. The sensor element 10 can be for example a Hall sensor element, a magnetoresistive sensor element, a vertical Hall sensor element or a fluxgate sensor element. A magnetoresistive xMR sensor element can be embodied in the form of an AMR sensor element, a GMR sensor element or a TMR sensor element. In the example in FIG. 1, the sensor element 10 can be arranged on a side of the sensor chip 8 facing away from the busbar 2. In a further example, the sensor element 10 can be arranged on a side of the sensor chip 8 facing the busbar 2.

The dielectric shell 4 can comprise or be fabricated from one or more inorganic materials. The inorganic material can comprise at least one out of a glass material or a ceramic material. A glass material can comprise alkali-free silicate glass, for example. A ceramic material can comprise aluminum oxide ($Al_2O_3$), for example. In comparison with other materials, inorganic materials may be more durable vis-à-vis aging processes of the material, which may be triggered by thermal effects and/or by moisture, for example, and at the same time have good isolation properties.

In FIG. 1, the dielectric shell 4 can be fabricated from a single inorganic material, by way of example. In further examples, the dielectric shell 4 can be fabricated from a plurality of different inorganic materials. In this regard, for example, the base of the dielectric shell 4 can be fabricated from a first inorganic material and one or more of the side walls of the dielectric shell 4 can be fabricated from a second inorganic material different therefrom. The dielectric shell 4 can be embodied in an integral fashion or can be assembled or joined together from a plurality of parts.

As viewed in the z-direction, the dielectric shell 4 and/or its base surface can have an arbitrary shape, for example round, oval, elliptic, square, rectangular, polygonal, etc. In the example in FIG. 1, the side walls of the dielectric shell 4 can be arranged substantially perpendicular to the base of the dielectric shell 4. In further examples, the angles between the base and the side walls of the dielectric shell 4 can be less than or greater than ninety degrees. Furthermore, in the example in FIG. 1, one or more of the side walls of the dielectric shell 4 can project beyond the top side of the sensor chip 8. In further examples, the top side of the sensor chip 8 can project above at least one of the side walls or be at an identical level with at least one of the side walls. The height of the side walls can be constant or vary in the course thereof. The sensor chip 8 can be spaced apart (in particular completely) from the dielectric shell 4, e.g., there is no point at which the sensor chip 8 and the dielectric shell 4 can make contact with one another.

The dielectric layer 6 can comprise or be fabricated from one or more materials. In FIG. 1, the dielectric layer 6 can be fabricated from a single material, by way of example. In further examples, the dielectric layer 6 can be fabricated from a plurality of different materials. The dielectric layer 6 can be embodied in an integral fashion or can be assembled or joined together from a plurality of parts. By way of example, the dielectric layer 6 can consist of a plurality of dielectric partial layers stacked one above another in the z-direction and can form a layer stack. The dielectric layer 6 and the dielectric shell 4 can comprise or be fabricated from an identical material/identical materials or different material/different materials.

For example, the dielectric layer 6 can comprise or be fabricated from one or more organic materials. An organic material can comprise at least one out of a polymer, a polyimide, Kapton®, an epoxy, a (in particular fluorinated) silicone, etc. Alternatively or additionally, the dielectric layer 6 can comprise or be fabricated from one or more inorganic materials. An inorganic material can comprise at least one out of a glass material, a ceramic material, silicon nitride, etc. A glass material can comprise alkali-free silicate glass, for example. A ceramic material can comprise aluminum oxide ($Al_2O_3$), for example.

Figure 5:
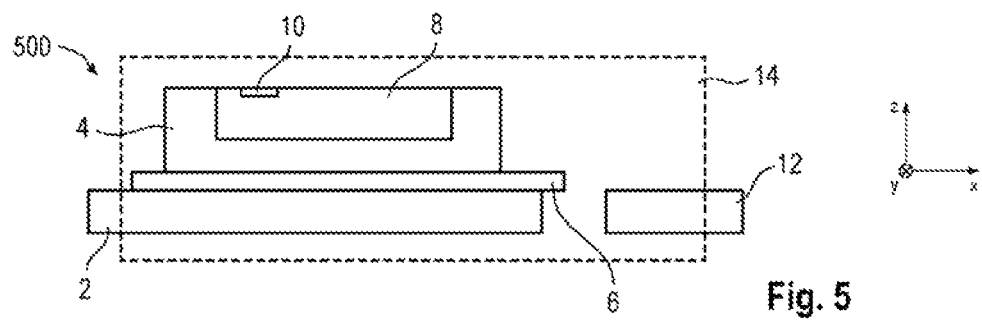
FIG. 5 schematically shows a cross-sectional side view of a sensor device 500 in accordance with the disclosure.

In the example in FIG. 1, the dielectric layer 6 can be arranged within the dielectric shell 4, in particular on a base surface of the dielectric shell 4. In this case, the dielectric layer 6 can cover the base surface of the dielectric shell 4 completely or only partly, as is shown in FIG. 1. In further examples, the dielectric layer 6 can be arranged outside the dielectric shell 4, as is shown in FIG. 5, for example. In the example in FIG. 1, it is possible for the inner and outer side walls of the dielectric shell 4 not to be covered by the dielectric layer 6. In further examples, the dielectric layer 6 can at least partly cover the inner and/or outer side walls of the dielectric shell 4.

As viewed in the z-direction, a footprint of the dielectric layer 6 can have an arbitrary shape, for example round, oval, elliptic, square, rectangular, polygonal, etc. In the example in FIG. 1, the footprints of the dielectric layer 6 and of the sensor chip 8 can be congruent as viewed in the z-direction. In further examples, the footprints need not necessarily be congruent, e.g., at least one of the two footprints can project laterally beyond the other footprint at at least one location. By way of example, the footprint of the sensor chip 8 can be arranged completely within the footprint of the dielectric layer 6.

The encapsulation material 14 can encapsulate one or more components of the sensor device 100 and form a housing, which can be configured to protect the encapsulated components against external influences, such as moisture or mechanical impacts, for example. The sensor device 100 can thus also be referred to as sensor housing, sensor package, semiconductor housing and/or semiconductor package. The busbar 2 and the connection conductor 12 can at least partly project from the encapsulation material 14 in order to be able to be electrically contacted from outside the encapsulation material 14. Sections of the busbar 2 that project from the encapsulation material 14 can provide an input and an output for an electric measurement current.

The encapsulation material 14 can be embodied in particular in an integral fashion and can comprise at least one or more of the following materials: a mold compound, a laminate, an epoxy, a filled epoxy, a glass fiber-filled epoxy, an imide, a thermoplastic, a thermosetting polymer, a polymer mixture, etc. Various techniques can be used for producing the encapsulation material 14, for example at least one out of compression molding, injection molding, powder molding, liquid molding, map molding, laminating, etc.

The encapsulation material 14 and the dielectrics 4 and 6 can be secured to one another along one (or more) interface(s) 16. This housing-internal material interface 16 between the encapsulation material 14 and the dielectrics 4 and 6 can be referred to as a cemented joint 16. During an aging process of the sensor device 100, an undesired delamination of the encapsulation material 14 from the dielectrics 4 and 6, or vice versa, can occur, as a result of which the joint 16 can be detached and opened at at least one location. In this case, one or more air volumes or air bubbles can arise between the encapsulation material 14 and the dielectrics 4 and 6. During electrical operation of the sensor device 100, there may then be the risk of the occurrence of housing-internal air breakdowns along air clearances in the air bubbles, in particular between the busbar 2 and electrically conductive regions of the sensor chip 8, as a result of which the sensor device 100 may be damaged. Furthermore, moisture and contaminants produced as a result of chemical reactions may arise on the exposed material surfaces delimiting the air bubbles and may cause short circuits along one or more creepage paths in particular between the busbar 2 and conductive regions of the sensor chip 8.

In order to reduce the risk of the air breakdowns and/or short circuits described, it is possible to define housing-internal geometric rules with regard to the material interface 16. In this context, a minimum distance 18 between the sensor chip 8 and the busbar 2 along the surfaces of the dielectric layer 6 and the dielectric shell 4 or along the housing-internal material interface 16 is indicated by an arrow in FIG. 1. A length of the minimum distance 18 can be in particular greater than 400 micrometers. Such a minimum length can ensure that air breakdowns and/or short circuits can be prevented despite delamination and air bubble formation associated therewith.

The minimum distance 18 between the sensor chip 8 and the busbar 2 along the housing-internal material interface 16 can depend, of course, on the shape and the dimensions of the dielectric shell 4 and the dielectric layer 6. In the example in FIG. 1, the minimum distance 18 can extend along a path as indicated by the arrow along the interface 16. An increased minimum distance 18 can be provided by the concave shape of the dielectric shell 4 in combination with the additional dielectric layer 6 arranged between the dielectric shell 4 and the sensor chip 8. The robustness of the sensor device 100 vis-à-vis possible air breakdowns and/or short circuits can be improved as a result. Furthermore, an increased galvanic isolation between the busbar 2 and the sensor chip 8 can be provided. The risk of a possible operational failure of the sensor device 100 can be avoided or at least reduced as a result. The use of the dielectric shell 4 thus makes it possible to achieve favorable influencing of the minimum distance 18 and thus a high reliability in a compact manner. The technical effects mentioned can be provided by each of the herein described sensor devices in accordance with the disclosure.

Figure 2:
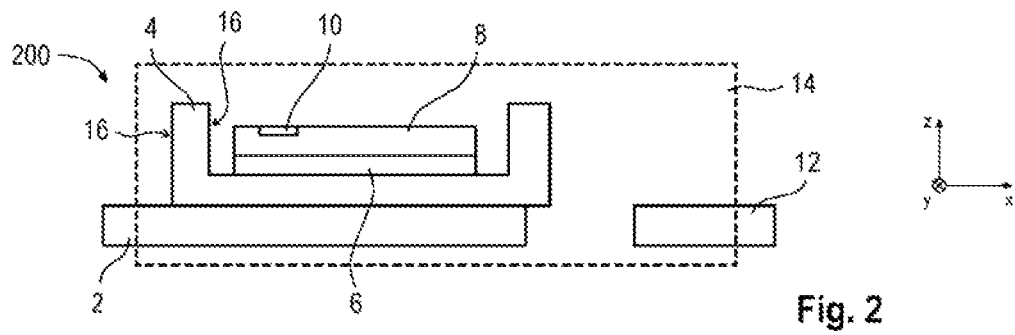
FIG. 2 schematically shows a cross-sectional side view of a sensor device 200 in accordance with the disclosure.

The sensor device 200 in FIG. 2 can have one or more features of the sensor device 100 in FIG. 1. In contrast to FIG. 1, in the sensor device 200, the dielectric shell 4 can project beyond an edge of the busbar 2 at at least one location. As a result, it is possible to further increase the minimum distance 18—described in association with FIG. 1—along the housing-internal interface 16 between the encapsulation material 14 and the dielectrics 4 and 6. In FIG. 2, the dielectric shell 4 can project beyond the right-hand edge of the busbar 2, by way of example.

Figure 3:
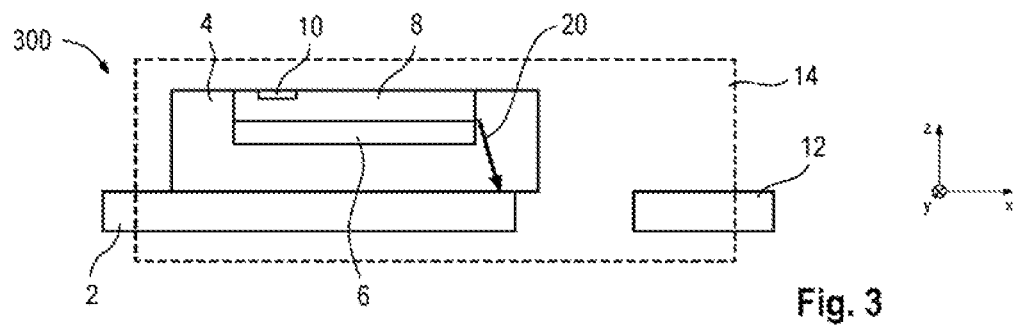
FIG. 3 schematically shows a cross-sectional side view of a sensor device 300 in accordance with the disclosure.

The sensor device 300 in FIG. 3 can have one or more features of the sensor devices described above. In contrast to the preceding examples, the dielectric shell 4 in the example in FIG. 3 can comprise or be fabricated from a mold compound. In this context, the dielectric shell 4 can be fabricated from a similar material and in a similar manner to the encapsulation material 14, and so, for the sake of simplicity, reference may be made to preceding explanations concerning the encapsulation material 14. The mold material of the dielectric shell 4 and the encapsulation material 14 can be different or identical.

The dielectric shell 4 can comprise or be fabricated from one or more mold compounds. In FIG. 1, the dielectric shell 4 can be fabricated from a single mold compound, by way of example. In further examples, the dielectric shell 4 can be fabricated from a plurality of different mold compounds. By way of example, the base of the dielectric shell 4 can be fabricated from a first mold compound and one or more of the side walls of the dielectric shell 4 can be fabricated from a second mold compound different therefrom. The dielectric shell 4 can be embodied in an integral fashion or can be assembled or joined together from a plurality of parts.

The mold compound or the dielectric shell 4 can cover one or more side walls of the sensor chip 8 in the example in FIG. 3. It is possible for that surface of the sensor chip 8 which faces away from the busbar 2 not to be covered by the mold compound. In particular, it is possible for the sensor element 10 of the sensor chip 8 not to be covered by the mold compound. In the example in FIG. 3, the top sides of the sensor chip 8 and of the mold compound can be flush, e.g., can lie in a common plane. In further examples, the top side of the sensor chip 8 can project from the top side of the mold compound, or the top side of the mold compound can at least partly project above the top side of the sensor chip 8.

In order to avoid an electrical breakdown or voltage breakdown between the busbar 2 and an electrically conductive region of the sensor chip 8 or at least to reduce a risk associated therewith, a minimum path 20 running exclusively through the mold compound between the sensor chip 8 and the busbar 2 can be longer than 400 micrometers.

Figure 4:
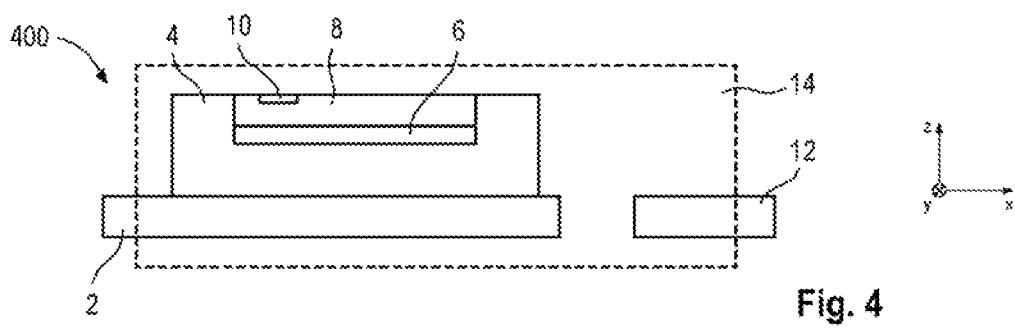
FIG. 4 schematically shows a cross-sectional side view of a sensor device 400 in accordance with the disclosure.

The sensor device 400 in FIG. 4 can have one or more features of the sensor device 300 in FIG. 3. In contrast to FIG. 3, the dielectric shell 4 in the sensor device 400 in FIG. 4 need not necessarily project beyond an edge of the busbar 2. As viewed in the z-direction, the footprint of the dielectric shell 4 can be arranged completely within the footprint of the busbar 2.

The sensor device 500 in FIG. 5 can have one or more features of the sensor devices described above. In contrast to the preceding examples, in the sensor device 500 in FIG. 5, the dielectric layer 6 can be arranged outside the dielectric shell 4 between the busbar 2 and the dielectric shell 4. In FIG. 5, the dielectric layer 6 can project beyond the right-hand edge of the busbar 2, by way of example. Furthermore, in the example shown, as viewed in the z-direction, the footprint of the dielectric shell 4 can lie completely within the footprint of the dielectric layer 6. As an alternative thereto, the dielectric shell 4 can project beyond the dielectric layer 6 at at least one location, for example beyond the left-hand end of the dielectric layer 6.

Figure 6:
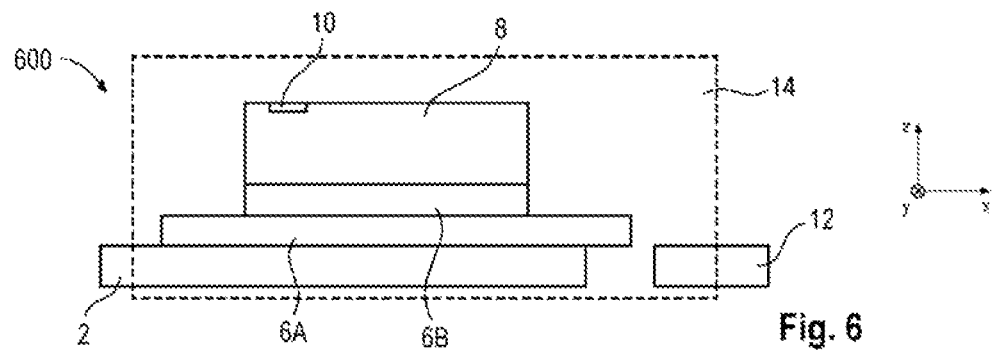
FIG. 6 schematically shows a cross-sectional side view of a sensor device 600 in accordance with the disclosure.

The sensor device 600 in FIG. 6 can have one or more features of the sensor devices described above. The sensor device 600 in FIG. 6 can comprise a busbar 2 and a sensor chip 8 arranged over the busbar 2 and having one or more sensor elements 10. The sensor chip 8 can be configured to detect a magnetic field induced by an electric measurement current carried by the busbar 2. A first dielectric layer 6A can be arranged between the busbar 2 and the sensor chip 8. Furthermore, a second dielectric layer 6B can be arranged between the first dielectric layer 6A and the sensor chip 8. It is possible for the footprints of the two dielectric layers 6A and 6B not to be congruent. The first dielectric layer 6A can project beyond an edge of the busbar 2 at at least one location. Analogously to preceding examples, the sensor device 600 can comprise one or more connection conductors 12 and the aforementioned components of the sensor device 600 can be at least partly encapsulated by an encapsulation material 14.

Each of the dielectric layers 6A and 6B can have one or more features of the dielectric layer 6 of the preceding examples. The dielectric layers 6A and 6B can comprise identical or different materials or can be fabricated from identical or different materials. In the example in FIG. 6, the first dielectric layer 6A can comprise or be fabricated from one or more inorganic materials. The second dielectric layer 6B can comprise or be fabricated from one or more organic materials.

In the example in FIG. 6, as viewed in the z-direction (plan view in the z-direction), the footprint of the second dielectric layer 6B can be arranged completely within the footprint of the first dielectric layer 6A. In other words, the first dielectric layer 6A can project completely beyond the second dielectric layer 6B. Furthermore, as viewed in the z-direction, the footprint of the sensor chip 8 and the footprint of the second dielectric layer 6B can be congruent, e.g., the side surfaces of the sensor chip 8 and of the second dielectric layer 6B can be flush. As an alternative thereto, the second dielectric layer 6B can have a larger dimension than the sensor chip 8 at at least one location in the x- and/or y-direction. In this case, the footprint of the sensor chip 8 can be arranged in particular completely within the footprint of the second dielectric layer 6B.

Figure 7:
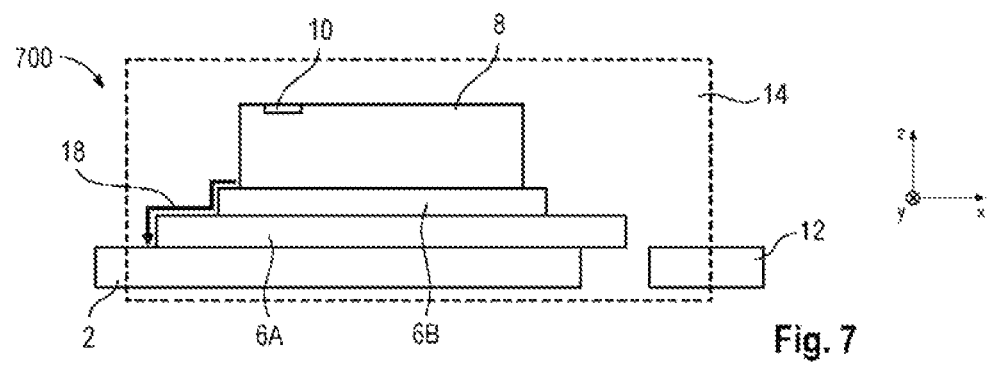
FIG. 7 schematically shows a cross-sectional side view of a sensor device 700 in accordance with the disclosure.

The sensor device 700 in FIG. 7 can have one or more features of the sensor device 600 in FIG. 6. In comparison with FIG. 6, material properties of the dielectric layers 6A and 6B can be interchanged in the sensor device 700 in FIG. 7. That is to say that, in FIG. 7, the first dielectric layer 6A can comprise or be fabricated from one or more organic materials, while the second dielectric layer 6B can comprise or be fabricated from one or more inorganic materials. Furthermore, the second dielectric layer 6B in FIG. 7 can have a larger dimension in the x-y-plane. As viewed in the z-direction, the footprint of the sensor chip 8 can lie completely within the footprint of the second dielectric layer 6B.

Analogously to FIG. 1, a minimum distance 18 between the sensor chip 8 and the busbar 2 along the surfaces of the two dielectric layers 6A and 6B or along the housing-internal material interface between the encapsulation material 14 and the dielectric layers 6A and 6B is indicated by an arrow in FIG. 7. In order to avoid air breakdowns and/or short circuits already described in association with FIG. 1, the length of the minimum distance 18 can be in particular greater than 400 micrometers. This minimum length can ensure that air breakdowns and/or short circuits can be prevented despite housing-internal air bubble formation.

Figure 8:
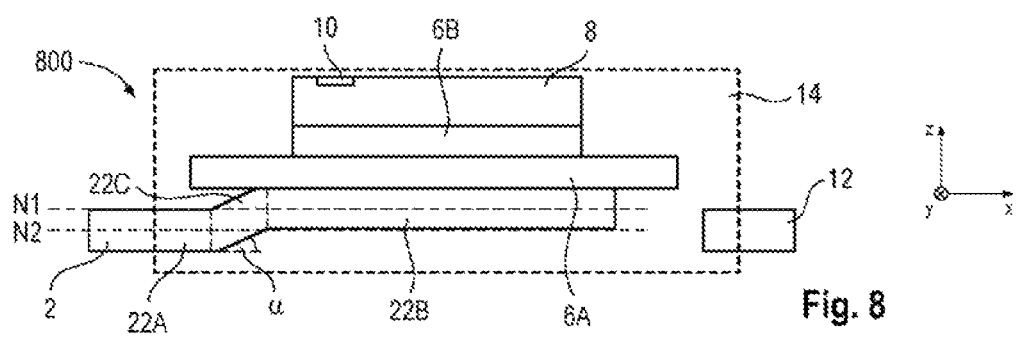
FIG. 8 schematically shows a cross-sectional side view of a sensor device 800 in accordance with the disclosure.

The sensor device 800 in FIG. 8 can have one or more features of the sensor device 700 in FIG. 7. Analogously to FIG. 7, in the sensor device 800 in FIG. 8, the first dielectric layer 6A can comprise or be fabricated from one or more organic materials, while the second dielectric layer 6B can comprise or be fabricated from one or more inorganic materials. In contrast to FIG. 7, in FIG. 8, the busbar 2 can be curved and spacing apart between the first dielectric layer 6A and the busbar 2 can be provided by the curvature of the busbar 2.

The busbar 2 can comprise two parts or sections 22A and 22B, which can lie at different levels N1 and N2 with respect to the z-direction. The first dielectric layer 6A can be arranged relative to the two sections 22A and 22B of the busbar 2 in such a way as to result in the spacing apart between the first dielectric layer 6A and the busbar 2. In the example in FIG. 8, a further section 22C of the busbar 2, which further section connects the two sections 22A, 22B lying at the different levels N1 and N2, can form an angle α with the sections. The value of the angle α can depend, of course, on the desired spacing apart between the busbar 2 and the first dielectric layer 6A. By way of example, the angle α can have a value of between approximately 10 degrees and approximately 90 degrees. The curvature of the busbar 2 can be provided by an arbitrary process, for example by one or more out of bending, stamping, embossing, etc. In this case, the busbar 2 can be embodied in particular in an integral fashion.

Figure 9:
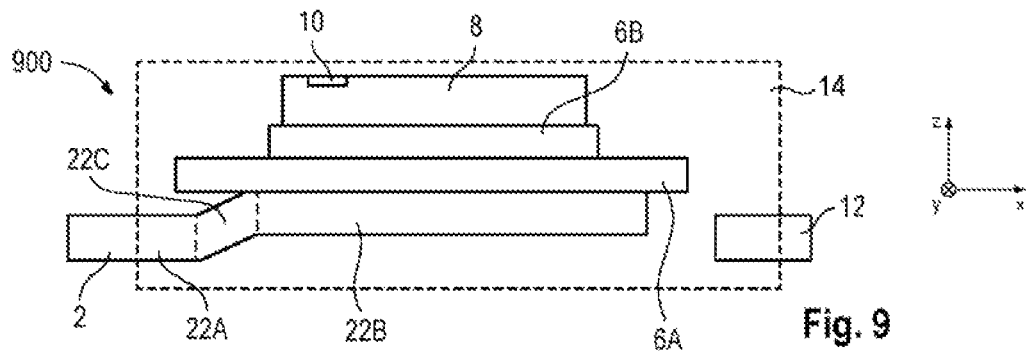
FIG. 9 schematically shows a cross-sectional side view of a sensor device 900 in accordance with the disclosure.

The sensor device 900 in FIG. 9 can have one or more features of the sensor device 800 in FIG. 8. In comparison with FIG. 8, material properties of the dielectric layers 6A and 6B can be interchanged in the sensor device 900 in FIG. 9. That is to say that, in FIG. 9, the first dielectric layer 6A can comprise or be fabricated from one or more inorganic materials, while the second dielectric layer 6B can comprise or be fabricated from one or more organic materials. Furthermore, the second dielectric layer 6B in FIG. 9 can have a larger dimension in the x-y-plane. As viewed in the z-direction, the footprint of the sensor chip 8 can lie completely within the footprint of the second dielectric layer 6B. Furthermore, as viewed in the z-direction, the footprint of the second dielectric layer 6B can be arranged completely within the footprint of the first dielectric layer 6A. In other words, the first dielectric layer 6A can project completely beyond the second dielectric layer 6B.

Figure 10:
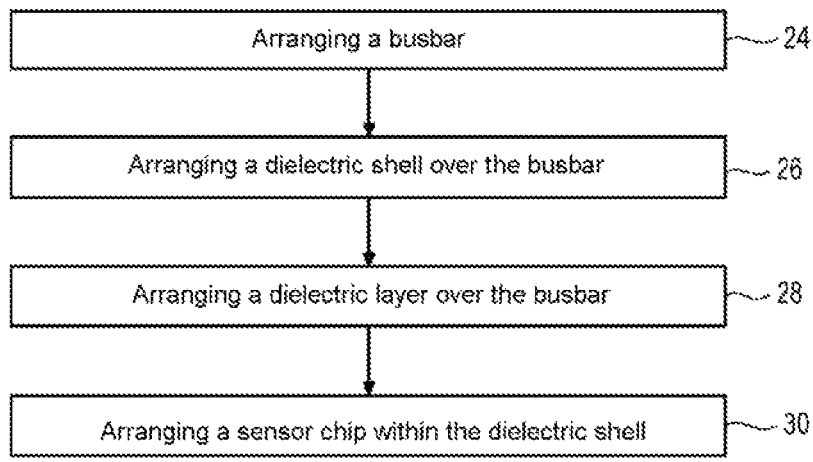
FIG. 10 shows a flow diagram of a method for producing a sensor device in accordance with the disclosure.

FIG. 10 shows a flow diagram of a method for producing a sensor device in accordance with the disclosure. The method can be used for example to fabricate one of the sensor devices shown in FIGS. 1 to 5. The method in FIG. 10 can be read in conjunction with each of these figures.

At 24, a busbar can be arranged. At 26, a dielectric shell can be arranged over the busbar. At 28, a dielectric layer can be arranged over the busbar. At 30, a sensor chip can be arranged within the dielectric shell. The sensor chip can be configured to detect a magnetic field induced by an electric current flowing through the busbar.

Figure 11:
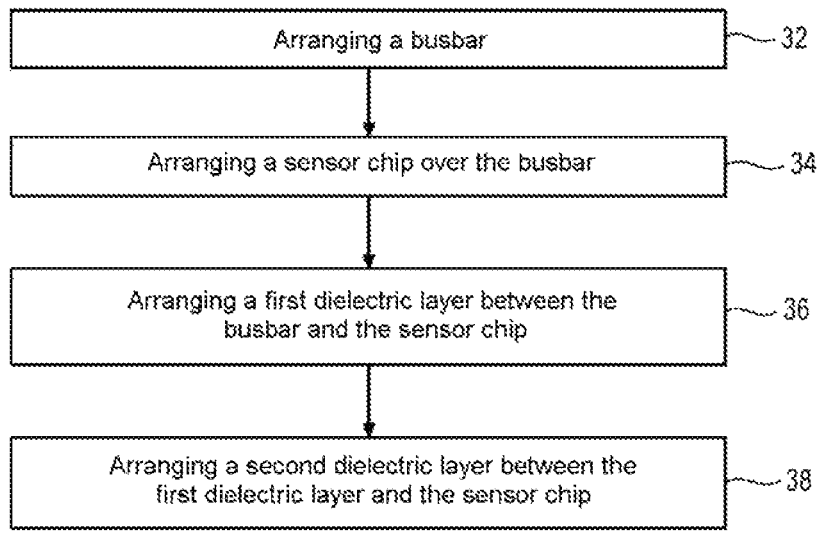
FIG. 11 shows a flow diagram of a method for producing a sensor device in accordance with the disclosure.

FIG. 11 shows a flow diagram of a method for producing a sensor device in accordance with the disclosure. The method can be used for example to fabricate one of the sensor devices shown in FIGS. 6 to 9. The method in FIG. 11 can be read in conjunction with each of these figures.

At 32, a busbar can be arranged. At 34, a sensor chip can be arranged over the busbar. The sensor chip can be configured to detect a magnetic field induced by an electric current flowing through the busbar. At 36, a first dielectric layer can be arranged between the busbar and the sensor chip. At 38, a second dielectric layer can be arranged between the first dielectric layer and the sensor chip. It is possible for the footprints of the two dielectric layers not to be congruent. The first dielectric layer can project beyond an edge of the busbar at at least one location.

The methods in FIGS. 10 and 11 can have further aspects. By way of example, a dielectric layer arranged on the sensor chip (such as, for example, the dielectric layer 6 in FIG. 1 or the dielectric layer 6B in FIG. 6) can be produced in a wafer-based process. In this case, the dielectric layer can for example be produced as rear-side passivation of the sensor chip and comprise in particular silicon nitride. Alternatively, the dielectric layer can be connected to the sensor chip based on a wafer bonding process, for example based on anodic bonding between silicon of the sensor chip and a glass material of the dielectric layer. Alternatively, the dielectric layer can be produced based on a wafer laminating process, wherein for example a polyimide or Kapton® film can be laminated onto the rear side of the semiconductor wafer from which the sensor chip is intended to be fabricated.

Aspects

Sensor devices in accordance with the disclosure are explained below based on aspects.

Aspect 1 is a sensor device, comprising: a busbar; a dielectric shell arranged over the busbar; a dielectric layer arranged over the busbar; and a sensor chip arranged within the dielectric shell, wherein the sensor chip is configured to detect a magnetic field induced by an electric current flowing through the busbar.

Aspect 2 is a sensor device in accordance with aspect 1, wherein at least one out of the dielectric shell or the dielectric layer projects beyond an edge of the busbar at at least one location.

Aspect 3 is a sensor device in accordance with aspect 1 or 2, wherein the dielectric layer is arranged within the dielectric shell between the dielectric shell and the sensor chip.

Aspect 4 is a sensor device in accordance with aspect 1 or 2, wherein the dielectric layer is arranged outside the dielectric shell between the busbar and the dielectric shell.

Aspect 5 is a sensor device in accordance with any of the preceding aspects, wherein the dielectric shell comprises an inorganic material.

Aspect 6 is a sensor device in accordance with aspect 5, wherein the inorganic material comprises at least one out of a glass material or a ceramic material.

Aspect 7 is a sensor device in accordance with aspect 5 or 6, wherein the sensor chip is spaced apart from the dielectric shell.

Aspect 8 is a sensor device in accordance with any of aspects 5 to 7, wherein a minimum distance between the sensor chip and the busbar along the surfaces of the dielectric layer and the dielectric shell is greater than 400 micrometers.

Aspect 9 is a sensor device in accordance with any of aspects 5 to 8, wherein a side wall of the dielectric shell projects beyond a surface of the sensor chip facing away from the busbar.

Aspect 10 is a sensor device in accordance with any of aspects 1 to 4, wherein the dielectric shell comprises a mold compound.

Aspect 11 is a sensor device in accordance with aspect 10, wherein: the mold compound covers side walls of the sensor chip, and a surface of the sensor chip facing away from the busbar is not covered by the mold compound.

Aspect 12 is a sensor device in accordance with aspect 11, wherein the surface of the sensor chip facing away from the busbar and a surface of the mold compound are flush.

Aspect 13 is a sensor device in accordance with any of aspects 10 to 12, wherein a minimum path running exclusively through the mold compound between the sensor chip and the busbar is longer than 400 micrometers.

Aspect 14 is a sensor device in accordance with any of the preceding aspects, wherein the dielectric layer comprises an organic material.

Aspect 15 is a sensor device in accordance with aspect 14, wherein the organic material comprises at least one out of a polymer, a polyimide, an epoxy or a silicone.

Aspect 16 is a sensor device in accordance with any of the preceding aspects, wherein the dielectric layer comprises an inorganic material.

Aspect 17 is a sensor device in accordance with aspect 16, wherein the inorganic material comprises at least one out of a glass material, a ceramic material or silicon nitride.

Aspect 18 is a sensor device in accordance with any of the preceding aspects, wherein footprints of the sensor chip and of the dielectric layer are congruent.

Aspect 19 is a sensor device, comprising: a busbar; a sensor chip arranged over the busbar, wherein the sensor chip is configured to detect a magnetic field induced by an electric current flowing through the busbar; a first dielectric layer arranged between the busbar and the sensor chip; and a second dielectric layer arranged between the first dielectric layer and the sensor chip, wherein footprints of the two dielectric layers are not congruent, and wherein the first dielectric layer projects beyond an edge of the busbar at at least one location.

Aspect 20 is a sensor device in accordance with aspect 19, wherein the footprint of the second dielectric layer is arranged completely within the footprint of the first dielectric layer.

Aspect 21 is a sensor device in accordance with aspect 19 or 20, wherein a footprint of the sensor chip is arranged completely within the footprint of the second dielectric layer.

Aspect 22 is a sensor device in accordance with aspect 19 or 20, wherein a footprint of the sensor chip and the footprint of the second dielectric layer are congruent.

Aspect 23 is a sensor device in accordance with any of aspects 19 to 22, wherein a minimum distance between the sensor chip and the busbar along the surfaces of the two dielectric layers is greater than 400 micrometers.

Aspect 24 is a sensor device in accordance with any of aspects 19 to 23, wherein the busbar is curved and spacing apart between the first dielectric layer and the busbar is provided by the curvature of the busbar.

Aspect 25 is a sensor device in accordance with any of aspects 19 to 24, wherein: one of the two dielectric layers is fabricated from an inorganic material, and the other of the two dielectric layers is fabricated from an organic material.

Within the meaning of the present description, the words "over" and "on" used for example with respect to a material layer that is formed "over" or "on" a surface of an object or is situated "over" or "on" the surface can be used in the present description in the sense that the material layer is arranged (for example formed, deposited, etc.) "directly on", for example in direct contact with, the surface meant. The words "over" and "on" used for example with respect to a material layer that is formed or arranged "over" or "on" a surface can also be used in the present text in the sense that the material layer is arranged (e.g., formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "aspect" is used in the present text in the sense that it serves as an aspect, a case or an illustration. An aspect or a configuration that is described as "aspect" in the present text should not necessarily be understood in the sense as though it has advantages over other aspects or configurations. Rather, the use of the word "aspect" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one out of A or B or the like generally means A or B or both A and B.

Devices and methods for producing devices are described in the present description. Observations made in connection with a device described can also apply to a corresponding method, and vice versa. If a specific component of a device is described, for example, then a corresponding method for producing the device can contain an action for providing the component in a suitable manner, even if such an action is not explicitly described or illustrated in the figures.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the example implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

The invention claimed is:

1. A sensor device, comprising:
   a busbar;
   a dielectric shell arranged over the busbar;
   a dielectric layer arranged over the busbar; and
   a sensor chip arranged within the dielectric shell, wherein the sensor chip is configured to detect a magnetic field induced by an electric current flowing through the busbar.

2. The sensor device as claimed in claim 1, wherein at least one of the dielectric shell or the dielectric layer projects beyond an edge of the busbar at at least one location.

3. The sensor device as claimed in claim 1, wherein the dielectric layer is arranged within the dielectric shell between the dielectric shell and the sensor chip.

4. The sensor device as claimed in claim 1, wherein the dielectric layer is arranged outside the dielectric shell between the busbar and the dielectric shell.

5. The sensor device as claimed in claim 1, wherein the dielectric shell comprises an inorganic material.

6. The sensor device as claimed in claim 5, wherein the inorganic material comprises at least one of a glass material or a ceramic material.

7. The sensor device as claimed in claim 5, wherein the sensor chip is spaced apart from the dielectric shell.

8. The sensor device as claimed in claim 5, wherein a minimum distance between the sensor chip and the busbar along a surface of the dielectric layer and along a surface of the dielectric shell is greater than 400 micrometers.

9. The sensor device as claimed in claim 5, wherein a side wall of the dielectric shell projects beyond a surface of the sensor chip in a direction facing away from the busbar.

10. The sensor device as claimed in claim 1, wherein the dielectric shell comprises a mold compound.

11. The sensor device as claimed in claim 10, wherein:
the mold compound covers side walls of the sensor chip, and
a surface of the sensor chip facing away from the busbar is not covered by the mold compound.

12. The sensor device as claimed in claim 11, wherein the surface of the sensor chip facing away from the busbar and a surface of the mold compound are flush.

13. The sensor device as claimed in claim 10, wherein a minimum path running exclusively through the mold compound between the sensor chip and the busbar is longer than 400 micrometers.

14. The sensor device as claimed in claim 1, wherein the dielectric layer comprises an organic material.

15. The sensor device as claimed in claim 14, wherein the organic material comprises at least one out of a polymer, a polyimide, an epoxy or a silicone.

16. The sensor device as claimed in claim 1, wherein the dielectric layer comprises an inorganic material.

17. The sensor device as claimed in claim 16, wherein the inorganic material comprises at least one of a glass material, a ceramic material, or silicon nitride.

18. The sensor device as claimed in claim 1, wherein a footprint of the sensor chip and a footprint of the dielectric layer are congruent.

19. A sensor device, comprising:
a busbar;
a sensor chip arranged over the busbar, wherein the sensor chip is configured to detect a magnetic field induced by an electric current flowing through the busbar;
a first dielectric layer arranged between the busbar and the sensor chip; and
a second dielectric layer arranged between the first dielectric layer and the sensor chip,
wherein a first footprint of the first dielectric layer and a second footprint of the second dielectric layer are not congruent, and
wherein the first dielectric layer projects beyond an edge of the busbar at at least one location.

20. The sensor device as claimed in claim 19, wherein the second footprint of the second dielectric layer is arranged completely within the first footprint of the first dielectric layer.

21. The sensor device as claimed in claim 19, wherein a third footprint of the sensor chip is arranged completely within the second footprint of the second dielectric layer.

22. The sensor device as claimed in claim 19, wherein a third footprint of the sensor chip and the second footprint of the second dielectric layer are congruent.

23. The sensor device as claimed in claim 19, wherein a minimum distance between the sensor chip and the busbar along a first surface of the first dielectric layer and along a second surface of the second dielectric layer is greater than 400 micrometers.

24. The sensor device as claimed in claim 19, wherein the busbar is curved and a spacing between the first dielectric layer and the busbar is provided by a curvature of the busbar.

25. The sensor device as claimed in claim 19, wherein:
a first one of the first dielectric layer or the second dielectric layer is fabricated from an inorganic material, and
a second one of the first dielectric layer or the second dielectric layer is fabricated from an organic material.

* * * * *